US008632943B2

(12) United States Patent
Platzer et al.

(10) Patent No.: US 8,632,943 B2
(45) Date of Patent: Jan. 21, 2014

(54) NEAR-INFRARED SENSITIVE, POSITIVE-WORKING, IMAGE FORMING COMPOSITION AND PHOTOGRAPHIC ELEMENT CONTAINING A 1,1-DI[(ALKYLPHENOXY)ETHOXY]CYCLOHEXANE

(75) Inventors: Stephan J. W. Platzer, Longmeadow, MA (US); James A. Bonham, Lake Elmo, MN (US); Kimberly R. Kukla, Medina, TN (US); Richard C. Wax, Kentwood, MI (US); Teresa Baker, Louisberg, NC (US); Ella Ross Ryan, Durham, NC (US)

(73) Assignee: Southern Lithoplate, Inc., Youngsville, NC (US)

( * ) Notice: Subject to any disclaimer, the term of this patent is extended or adjusted under 35 U.S.C. 154(b) by 86 days.

(21) Appl. No.: 13/361,244

(22) Filed: Jan. 30, 2012

(65) Prior Publication Data

US 2013/0196267 A1 Aug. 1, 2013

(51) Int. Cl.

| | |
|---|---|
| ***B41N 1/00*** | (2006.01) |
| ***B41M 5/00*** | (2006.01) |
| ***G03F 1/00*** | (2012.01) |
| ***G03F 7/26*** | (2006.01) |
| ***G03C 1/00*** | (2006.01) |
| ***G03C 1/52*** | (2006.01) |

(52) U.S. Cl.
USPC ..................... 430/270.1; 430/281.1; 430/302; 430/170; 430/294; 101/453; 101/463.1

(58) Field of Classification Search
None
See application file for complete search history.

(56) References Cited

U.S. PATENT DOCUMENTS

| | | | | |
|---|---|---|---|---|
| 4,101,323 | A | 7/1978 | Buhr et al. | 430/170 |
| 4,115,128 | A | 9/1978 | Kita | 430/191 |
| 4,247,611 | A | 1/1981 | Sander et al. | 430/286.1 |
| 4,356,252 | A | 10/1982 | Lee | 430/270.1 |
| 4,619,998 | A | 10/1986 | Buhr | 544/193.1 |
| 5,340,699 | A | 8/1994 | Haley et al. | 430/302 |
| 5,399,778 | A | 3/1995 | Steffen et al. | 568/591 |
| 5,480,762 | A | 1/1996 | Toyama et al. | 430/302 |
| 5,731,123 | A | 3/1998 | Kawamura et al. | 430/176 |
| 5,932,392 | A | 8/1999 | Hirai et al. | 430/270.1 |
| 6,051,361 | A | 4/2000 | Hattori et al. | 430/270.1 |
| 6,083,662 | A | 7/2000 | Miller et al. | 430/302 |
| 6,165,676 | A * | 12/2000 | Hattori | 430/270.1 |
| 6,174,646 | B1 | 1/2001 | Hirai et al. | 430/302 |
| 6,391,512 | B1 | 5/2002 | Hirai et al. | 430/176 |
| 6,399,279 | B1 | 6/2002 | Urano et al. | 430/302 |
| 7,147,995 | B2 | 12/2006 | Takamiya | 430/331 |
| 7,229,739 | B2 | 6/2007 | Perron et al. | 430/270.1 |
| 7,255,972 | B2 | 8/2007 | Nishiwaki et al. | 430/270.1 |
| 7,332,259 | B2 | 2/2008 | Takagi | 430/270.1 |
| 7,670,450 | B2 | 3/2010 | Lamansky et al. | 156/235 |
| 7,682,776 | B2 | 3/2010 | Teng | 430/302 |
| 2001/0009129 | A1 * | 7/2001 | Kunita et al. | 101/453 |
| 2006/0046187 | A1 | 3/2006 | Kuroki et al. | 430/270.1 |
| 2006/0269869 | A1 | 11/2006 | Takada | 430/270.1 |
| 2007/0065754 | A1 | 3/2007 | Kuroki et al. | 430/270.1 |
| 2007/0172758 | A1 | 7/2007 | Maehashi | 430/270.1 |
| 2007/0287097 | A1 | 12/2007 | Suzuki et al. | 430/270.1 |
| 2009/0029283 | A1 | 1/2009 | Takagi | 430/270.1 |
| 2009/0075201 | A1 * | 3/2009 | Miyoshi | 430/283.1 |
| 2009/0110832 | A1 | 4/2009 | Sampei | 427/288 |
| 2009/0170139 | A1 | 7/2009 | Mishima et al. | 435/11 |
| 2009/0311621 | A1 | 12/2009 | Takagi | 430/270.1 |

FOREIGN PATENT DOCUMENTS

| | | |
|---|---|---|
| JP | 63-149640 | 6/1988 |
| JP | 09-171254 | 6/1997 |
| JP | 03-644002 | 4/2005 |

OTHER PUBLICATIONS

Thomas, Bejoy, et al. "Synthesis of Dimethyl Acetal of Keytones: Design of Solid Acid Catalysts for One-Pot Acetalization Reaction." Microporous and Mesoporous Materials 80 (2005) 65-72.

"Cyclohexanone." National Institute of Standards and Technology, Material Measurement Laboratory, 2011. data compilation Copyright by the U.S. Secretary of Commerce on behalf of the U.S.A.

* cited by examiner

*Primary Examiner* — Chanceity Robinson
(74) *Attorney, Agent, or Firm* — Roberts & Roberts, LLP

(57) ABSTRACT

An infrared sensitive, positive-working, image forming composition and element are disclosed. The image forming composition comprises a 1,1-di[(alkylphenoxy)ethoxy]cyclohexane, an infrared absorbing dye having a maximum absorption peak in the range of from about 700 nm to about 1100 nm, and a novolac polymer. The composition is applied and dried on a planar, hydrophilic substrate to form an image forming element, in particular, a planographic printing plate. Upon imagewise exposure to a near-infrared radiation source, the infrared dye absorbs light in the exposed areas and converts it to heat, which causes a disruption in the matrix of the image forming composition. Upon development with an aqueous alkaline developer, the exposed areas are removed while the nonexposed areas remain, thus forming a positive image.

18 Claims, No Drawings

NEAR-INFRARED SENSITIVE, POSITIVE-WORKING, IMAGE FORMING COMPOSITION AND PHOTOGRAPHIC ELEMENT CONTAINING A 1,1-DI[(ALKYLPHENOXY)ETHOXY]CYCLOHEXANE

BACKGROUND OF THE INVENTION

1. Field of the Invention

The invention relates to an image forming composition which comprises a) a ketal compound of the class of ketals known as 1,1-di[(alkylphenoxy)ethoxy]cyclohexanes, b) a near-infrared absorbing dye, and c) an alkali-soluble polymer. The ketal compound has hydrophilic groups and lipophilic groups. In general, the ratio of the molecular mass of the hydrophilic groups relative to the molecular mass of the lipophilic groups determines the solubility of the ketal in different solvents. The ketal compound is designed to be partially or totally water-soluble in an aqueous alkaline composition. Such image forming compositions are useful as part of positive-working, lithographic printing plates that are imagewise exposed to near-infrared radiation and then developed.

2. Description of the Related Art

There is great commercial interest in producing positive-working photographic elements, such as lithographic printing plates, having image forming composition coatings that are digitally imageable using near-infrared exposure. With positive-working plates, once the coating is imagewise exposed to such radiation, the exposed areas are easily removed, while the unexposed areas remain as the image. Positive-working, imageable compositions containing novolac or other phenolic polymeric binders and diazoquinone imaging components have been prevalent in the lithographic printing plate and photoresist industries for many years. Imageable compositions based on alkali-soluble polymers with various dissolution inhibitors and infrared radiation absorbing compounds are also well known. The dissolution inhibitors are believed to prevent dissolution by hydrogen bonding of the normally alkali-soluble polymers prior to imaging. During actinic exposure, it is generally believed that the mechanism of image formation occurs by an increase in alkaline solubility due to a disruption or breaking of the hydrogen bonds.

It is well known in the art that diazonaphthoquinone sulfonates are excellent dissolution inhibitors for novolacs, which are condensation products of phenols with formaldehyde. These novolacs generally are soluble in aqueous alkaline solutions. Imagewise exposure of a diazonaphthoquinone sulfonate in a coated novolac-containing layer produces an indene carboxylic acid, which does not inhibit the dissolution of the novolac, thereby creating a solubility difference between the exposed areas and the nonexposed areas. The exposed areas can be removed with an alkaline developer. This chemistry is described in much greater detail by R. Dammel in Diazonaphthoquine-based Resists, 1993, SPIE—The International Society for Optical Engineering (Bellingham, Wash.). Typical active absorption bands for the diazonaphthoquinone sulfonate lie between 350 nm and 400 nm. Therefore, these compounds and their coatings should be stored in the dark or at least under yellow light conditions, namely, with light which has been filtered to block light below about 500 nm.

It is also known in the art that dissolution inhibitors having acid-cleavable C—O—C groups can be used in combination with novolacs. Representative of such compounds are 2-tetrahydropyranyl ethers described in U.S. Pat. No. 3,779,778; ortho-carboxylic acid esters described in U.S. Pat. No. 4,101, 323; polyacetals described in U.S. Pat. No. 4,247,611; and ketals described in U.S. Pat. No. 6,165,676. These compounds prevent dissolution of normally alkali-soluble phenolic polymers in alkaline developer solutions. Moreover, these dissolution inhibitors are normally mixed with photolytic acid-generating compounds in the image forming composition. Upon imagewise exposure of the composition to actinic radiation, an acid is released from the photolytic acid-generating compound that then catalyzes the decomposition of the dissolution inhibitors in the exposed regions. When this occurs, the exposed region can then be selectively dissolved in an aqueous-based, alkaline developer. Typical acid-generating compounds include trichloromethyl triazines whose absorption range extends to 500 nm. The typical absorption maximum is the range from about 330 nm to about 450 nm. Examples of such triazines are given in U.S. Pat. No. 4,619,998, and are sensitive to violet light (390-450 nm). Therefore, these compounds, like the diazonaphthoquinones, must be stored in the dark or at least under yellow light conditions. Because diazonaphthoquinones, trichloromethyl triazines, and other acid generators do not absorb in the near-infrared region, infrared radiation absorbing compounds are normally added to the image forming composition. Near-infrared absorbing dyes are well known. Examples of such dyes are given in U.S. Pat. No. 7,147,995.

U.S. Pat. No. 5,340,699 discloses an image forming material comprising a novolac binder, a resole polymer, infrared absorber, and an acid generator. The material is positive-working when an optional heating step after imagewise exposure and before development is not applied. The material is near-infrared sensitive, ultraviolet sensitive, and partially visible sensitive.

The dissolution inhibitors having acid-cleavable C—O—C groups are believed to prevent dissolution by hydrogen bonding of the normally alkali-soluble phenolic binder polymers prior to imaging. During actinic exposure, it is generally believed that the mechanism of image formation occurs by an increase in alkaline solubility due to the cleavage of the C—O—C groups of the ketal by the formed acid. Simple ketals of 1,1-dialkoxycyclohexane are generally poor dissolution inhibitors, due to the lack of hydrogen bonding sites. Examples of simple ketals include 1,1-dimethoxycyclohexane (Mw 144), 1,1-diethoxycyclohexane (Mw 172), and 1-1-di(1-methoxyethoxy)cyclohexane (Mw 200).

A particular group of ketal dissolution inhibitors of the class 1,1-di[(alkylphenoxy)ethoxy]cyclohexanes having the general formula $[(R')_rC_6H_{(5-r)}O(CH_2CH_2O)_m][(RR'')_5C_6H_{(5-s)}O(CH_2CH_2O)_n]C_6H_{10}$ wherein m and n are independently an integer of from 1 to 5; r and s are independently an integer of from 1 to 3; and R' and R'' are independently a hydrogen atom or an alkyl group having 1 to 5 carbon atoms are described in U.S. Pat. No. 6,165,676; U.S. Pat. No. 6,391,512; U.S. Pub. No. 2007/0172758; and U.S. Pub. No. 2009/0075201. The alkyl groups of R' and R'' may be straight or branched, and include methyl, ethyl, propyl, butyl, and pentyl groups. The specific example of such ketals in the above-mentioned patents and patent applications is the ketal wherein m and n are 1; and R' and R'' are hydrogen atoms. The formula for this specific ketal is $[C_6H_5—O—(CH_2CH_2O)][C_6H_5O(CH_2CH_2O)]C_6H_{10}$. This 1,1-di(2-phenoxyethoxy)cyclohexane (CAS 115815-82-2) is water insoluble. Strong acids will decompose this ketal into cyclohexanone and 2-phenoxyethanol, which has a low solubility of 27 g/l in water. It is desired that the compounds in the photosensitive layer after exposure to near-infrared light be soluble in an aqueous developer. Due to their water⁻ insoluble characteristics, neither this specific ketal nor its acid-decomposed part is suitable for an aqueous developer. Furthermore, due to the relatively low molecular weight of 356 for this specific ketal, lithographic coatings with this ketal tend to have lower printing durability in the image areas of the printing plate. In addition, due to the lack of lipophilic alkyl groups on this specific ketal, coatings with this ketal tend to not accept printing inks well. The preferred acid-generating compounds for these ketals in the examples of the four above-mentioned references are trichloromethyl triazines, which are ultraviolet sensitive and partially visible sensitive. It is desired that the image forming composition be sensitive to near-infrared radiation but not to violet radiation, namely, do not require an acid generator. Therefore, a special group of ketals that are partially or totally water-soluble have been developed so that the addition of acid-generating compounds is not required.

SUMMARY OF THE INVENTION

The invention provides an image forming composition which comprises:

a) a ketal having the formula:

Formula 1

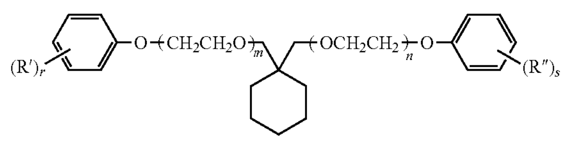

wherein R' and R" independently are an alkyl group having from 8 to about 20 carbon atoms;

m and n independently are an integer of from 1 to about 200; and r and s independently are an integer of from 1 to 3;

b) an infrared absorbing dye which has a maximum absorption peak in the range of from about 700 nm to about 1100 nm; and c) a polymer which is soluble in an aqueous alkaline solution.

The invention also provides an image forming element which comprises a substrate, and the above image forming composition substantially dried on the substrate.

The invention further provides a planographic printing plate comprising a planar substrate having at least one hydrophilic surface; and the above image forming composition substantially dried on the at least one hydrophilic surface.

The invention still further provides a method for forming a planographic printing plate which comprises providing a planar substrate which comprises aluminum having at least one hydrophilic surface; applying the above image forming composition onto at least one said hydrophilic surface; drying the image forming composition to thereby produce a dried image forming layer; and then conditioning the dried image forming layer at a temperature of from about 40° C. to about 70° C. for from about 2 hours to about 200 hours.

The invention yet further provides a method for forming an image which comprises a) providing the above image forming element; b) imagewise exposing the substantially dried image forming composition to sufficient infrared radiation to thereby provide imagewise exposed areas and non-exposed areas of the image forming composition; and then c) developing the image forming element by removing the imagewise exposed areas of the image forming composition and not removing the non-exposed areas of the image forming composition, with an aqueous alkaline composition.

DESCRIPTION OF THE INVENTION

The invention provides an image forming composition which comprises a ketal compound, a near-infrared absorbing dye, and an alkali-soluble polymer. The ketal compound is from the particular class of ketals known as 1,1-di(alkylphenoxyethoxy)cyclohexanes that are either partially or totally soluble in water, have both hydrophilic groups and lipophilic groups, and have a boiling point of about 200° C. or higher. The ketal compounds are stable and do not evaporate in coatings during the drying process at a temperature of above 80° C. These ketal compounds act as dissolution inhibitors in the image forming compositions for positive-acting, lithographic plates imaged with thermal energy, namely, near-infrared light. The image forming compositions with these specific ketal compounds exhibit better development characteristics and improved press performance, while maintaining good shelf life, in comparison to compositions with prior-art ketals.

The ketals compounds that are used in the present invention have the Formula 1, wherein R' and R" are independently an alkyl group having from 8 to about 20 carbon atoms; m and n independently are an integer of from 1 to about 200; and r and s independently are an integer of from 1 to 3. R' and R" may be the same alkyl group. They may be a branched-chain or straight-chain alkyl group. Non-limiting representative examples of R' and R" as straight-chain alkyl groups include 1-octyl; 2-octyl; 3-octyl; 4-octyl; 1-nonyl; 2-nonyl; 5-nonyl; 1-decyl; 2-decyl; 1-undecyl; 2-undecyl; 1-dodecyl; 2-dodecyl; 1-tridecyl; 1-tetradecyl; 2-tetradecyl; 1-pentadecyl; 1-hexadecyl; 2-hexadecyl; 1-heptadecyl; 1-octadecyl; 1-nonadecyl; and 1-eicosyl. Non-limiting examples of R' and R" as branched-chain alkyl groups include 1,1,3,3-tetramethyl-1-butyl; 3-ethyl-2,2-dimethyl-3-pentyl; 2-propyl-1-pentyl; 1,1,4,4-tetramethyl-1-pentyl; 2,4,4-trimethyl-1-pentyl; 5,5-dimethyl-1-hexyl; 2-ethyl-1-hexyl; 3,5,5-trimethyl-1-hexyl; 2,6-dimethyl-4-heptyl; 3,6-dimethyl-3-heptyl; 4-methyl-3-heptyl; 6-methyl-2-heptyl; 2-butyl-1-octyl; 3,7-dimethyl-1-octyl; 3,7-dimethyl-3-octyl; 3-methyl-3-octyl; 2-hexyl-1-decyl; and 2-octyl-1-dodecyl. In one embodiment, R' and R" are independently 1,1,3,3-tetramethyl-1-butyl or 1,1,4,4-tetramethyl-1-pentyl.

The numbers m and n of Formula 1 may be the same integer. Likewise, r and s of Formula 1 may be the same integer. If r and s are both 1, then the R' and R" are normally each attached at the 4-position of their respective phenyl group.

The ketal compounds that are used in the present invention typically are prepared by an acid catalyzed transketalization reaction of 1,1-dimethoxycyclohexane or 1,1-diethoxycyclohexane with alcohols having a phenoxy group, at least one ethoxy group, and at least one alkyl group, wherein the phenoxy group is between the ethoxy group(s) and the alkyl group(s). These alcohols are selected from surfactants such as (alkylphenoxy)ethanol surfactants. The preferred alcohols are selected from the group of 2-(alkylphenoxy)ethanol surfactants or from the group of 2-[2-(alkylphenoxy)polyethoxy]ethanol surfactants. The reaction is illustrated in the general Equation 1, wherein R is either a methyl group or an ethyl group. The other symbols, namely, R', R", m, n, r, and s, are defined above for Formula 1.

Equation 1

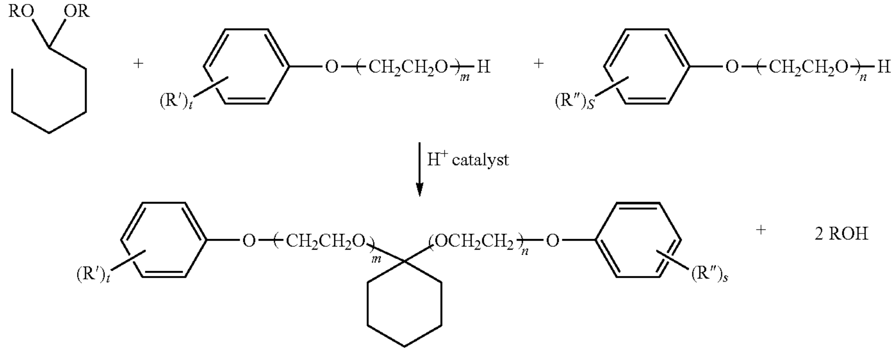

The reaction is conducted in the presence of an acid catalyst. Useful acid catalysts non-exclusively include Lowry-Bronsted acids which give up a proton. Non-exclusive examples of carboxylic acids, which are Lowry-Bronsted acids, include formic acid, acetic acid, oxalic acid, benzoic acid, and p-toluic acid. Preferred Lowry-Bronsted acids include phosphonic acids and sulfonic acids. Most preferred Lowry-Bronsted acids are sulfonic acids. Useful sulfonic acids include benzenesulfonic acid, p-toluenesulfonic acid (also known as 4-methylbenzenesulfonic acid), and 2-naphthalene sulfonic acid. The reaction is optionally conducted with the components in admixture with an organic solvent. Useful organic solvents non-exclusively include cyclohexane, benzene, and toluene. A preferred solvent includes toluene. The reaction is usually conducted at a temperature from about 60° C. to about 180° C., preferably from about 80° C. to about 120° C. to produce a result. The reaction solution is allowed to reflux and the low molecular weight alcohol byproduct is removed by azeotropic distillation. Methanol is removed when 1,1-dimethoxycyclohexane is used, or ethanol is removed when 1,1-diethoxycylcohexane is used. The reaction progress can be followed by the decrease in the FTIR absorption peak between 3200 $cm^{-1}$ and 3500 $cm^{-1}$, which corresponds to the O—H stretch of the alcohol. Upon completion of the reaction, it is preferred to neutralize the result by treating it with an aqueous base until a pH of from about 6 to about 7 is attained. This neutralization step increases the stability of the ketal. A suitable aqueous base includes a water solution of sodium hydroxide or potassium hydroxide. The reaction solution is dried over anhydrous potassium carbonate, filtered, and then concentrated under a reduced pressure. The purity of the resulting ketal, as determined by HPLC, is greater than 95%.

The hydroxyl compounds that are preferred for this invention are selected from the derivatives of polyoxyethylene compounds, and, of these compounds, the most preferred are those considered to be surface-active condensation products of polyoxyethylene. A thorough description of these compounds can be found in the Nonionic Surfactants, 1967, Vol. 1, Chapters 1-12; Cationic Surfactants Organic Chemistry, 1990, Vol. 34, Chapters 1-2; and Alkylene Oxides and Their Polymers, 1990, Vol. 35, Surfactant Science Series, Marcel Dekker, Inc. (New York). Many of these compounds are commercially available and are described in McCutcheons 2009, Volume 1: Emulsifiers & Detergents, and Volume 2: Functional Materials, Manufacturing Confectioner Publishing Company (Princeton, Wis.).

Non-limiting representative examples of the (alkylphenoxy)ethanol type of alcohols useful in the preparation of the ketal compounds are listed in Table 1.

TABLE 1

| |
|---|
| 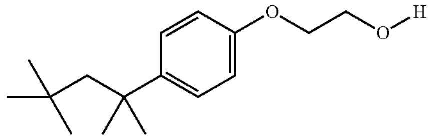 [SMILES: CC(C)(C)CC(C)(C)c1ccc(OCCO)cc1] |
| 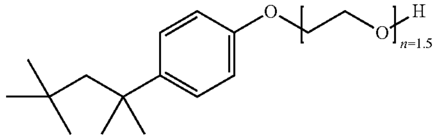 |
| 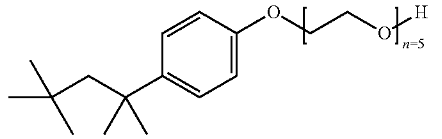 |
| 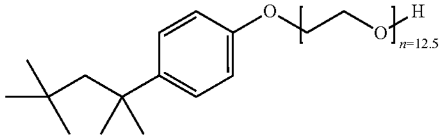 |
| 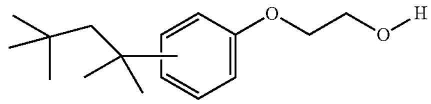 |
| 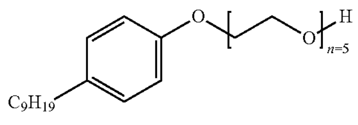 |
| 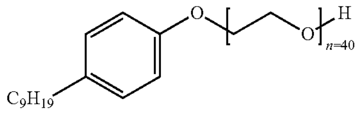 |
| 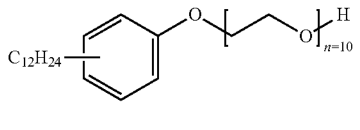 |

TABLE 1-continued

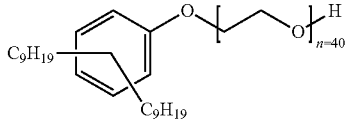

Preferred alkylphenoxyethanols whose alkyl group has from 8 to about 20 carbon atoms non-exclusively include 2-[2-(octylphenoxy)polyethoxy]ethanol (CAS 9036-19-5), such as those from the Igepal CA series; 2-[2-(4-octylphenoxy)polyethoxy]ethanol (CAS 9002-93-1), such as those from the Triton X series; 2-[2-(nonylphenoxy)polyethoxy] ethanol (CAS 9016-45-9), such as those from the Igepal CO series; 2-[2-(4-nonylphenoxy)polyethoxy]ethanol (CAS 127087-87-0), such as those from the Tergitol NP series; 2-[2-(isononylphenoxy)polyethoxy]ethanol (CAS 37205-87-1), such as those from the Neonal AF series; 2-[2-branchednonylphenoxy)polyethoxy]ethanol (CAS 68412-54-4); 2-[2-(dodecylphenoxy)polyethoxy]ethanol (CAS 9014-92-0), such as those from the Igepal RC series; and 2-[2-(dinonylphenoxy)polyethoxy]ethanol (CAS 9014-93-1), such as those from the Igepal DM series. The most preferred alkyphenoxyethanols whose alkyl group has from 8 to about 10 carbon atoms nonexclusively include 2-[4-(1,1,3,3-tetramethyl butyl)phenoxy]ethanol, such as Triton X-15; 2-{2-[(1,1,3,3-tetramethylbutyl)phenoxy] polyethoxy}ethanol with four ethoxy groups, such as Igepal CA-520; 2-{2-[4-(1,1,3,3-tetramethylbutyl)phenoxy] polyethoxy}ethanol with nine ethoxy groups, such as Triton X-100; and 2-{2-[4-(1,1,3,3-tetramethylbutyl)phenoxy] polyethoxy}ethanol with twenty nine ethoxy groups, such as Triton X-305, but without the 30% water. Some commercially available alkyphenoxyethanols are listed in U.S. Pub. No. 2009/0170139. It is well known that the average number of ethoxy groups in these surfactants usually is determined by the mole ratio of ethylene oxide to the alkylphenol used in making these surfactants. Analysis by mass spectrometry or nuclear magnetic resonance, for example, shows that when the average mole ratio is equal to 5, then the individual mole ratios may range from 2 to 8. For example, see U.S. Pat. No. 5,484,919, page 23, line I, for an analysis of Igepal CO-520.

It is advantageous that the ketal compounds be prepared from a wide range of 2-[2-(alkylphenoxy)polyethoxy]ethanol surfactants. These surfactants are amphiphilic, containing both a hydrophilic part and a lipophilic part, namely, the ethoxy moiety and the alkylphenoxy moiety, respectively. It is reasonable to expect that the nature of the hydrophilic part and the lipophilic part of the surfactants will greatly influence the properties of the ketals of the invention. Each alkylphenoxy moiety at the ends of the ketal molecule can be selected to have a particular carbon chain-length alkyl fragment, having eight or greater number of carbons, up to 20, while each ethoxy moiety in the middle of the ketal molecule can be selected to have a particular number of ethoxy groups, from 1 to about 200. The cyclohexane moiety at the center of the ketal molecule will influence to some degree the amphiphilic nature of the ketal molecule. However, the nature of the lipophilic alkyl substituents on the two alkylphenoxy moieties and the number of hydrophilic ethoxy groups would be expected to greatly influence the ketal's amphiphilic properties and its behavior in a liquid solution and in a dry coating. This especially applies to optimizing the performance of these ketals as dissolution inhibitors in coatings useful in thermal-sensitive, positive-working, lithographic coatings.

This includes the important properties of hydrogen bonding, solubility in coating solvents and processing chemicals, ink/water balance, and press life.

The ketal compounds that are represented by Formula 1 were surprisingly discovered to be either partially or totally soluble in water even when prepared from surfactants that are water-insoluble. Likewise, these ketals were found to be either partially or completely soluble in aqueous alkaline developers that commonly are used to develop positive-working coatings. The ketals compounds have a boiling point of about 200° C. or higher. The higher boiling point minimizes their evaporation from coatings, especially during the drying process of removing coating solvents, which require a high drying temperature, generally above about 80° C.

The ketal compounds that are represented by Formula 1 are improved dissolution inhibitors in the well-known positive-acting, lithographic compositions containing phenolic binders. The physical properties of the ketals of the present invention are believed responsible for the improved performance. For example, these ketals are medium-to-high viscosity liquids or waxy solids. It is expected that these ketals remain in that state in the coating composition. It is postulated that their physical state enhances their ability to act as dissolution inhibitors by the formation of hydrogen bonds in the liquid state during the drying of the coating at above about 80° C. and then during the cooling of the coating to room temperature. The disruption of the hydrogen bonds and possibly of other bonds caused by the much higher temperatures achieved in the thermal heating in the imaged area will enhance solubility, leading to greater solubility difference between the exposed and nonexposed areas. Ketals that have lower chain alkyl groups attached to the phenoxy group and lower number of ethoxy groups, such as those described in U.S. Pat. No. 6,165,676, are crystalline. It is postulated that these crystalline ketals form crystals slowly in the coatings, leading to a non-uniform distribution of the ketals. Furthermore, these ketals and their resulting alcohols are water-insoluble, whereas the ketals of the present invention are either partially or completely water-soluble which is believed to be responsible for easier removal of the thermally exposed regions by the processing fluid, which is most commonly an aqueous alkaline solution. The ketals of this invention are more fully described in U.S. patent application Ser. No. 13/361,129, filed on even date herewith, which application is incorporated herein by reference.

The second ingredient of the image forming composition of this invention is a near-infrared absorbing dye. The dye makes the composition sensitive to near-infrared radiation. A useful infrared absorbing dye has a maximum absorption peak in the range of from about 700 nm to about 1100 nm, when measured in an organic solvent, commonly methanol (CAS 67-56-1). A preferred infrared dye has a maximum absorption between about 770 nm and about 830 nm. The maximum active absorption may be red shifted in the solid state. The dye is not limited to specific ones. It includes those know in the art, such as azo dyes, metal complex azo dyes, pyrazolone azo dyes, quinoneimine dyes, methine dyes, napthoquinone dyes, squarylium dyes, cyanine dyes, and the like. An example of a squarylium dye is 1,3-bis[2,3-dihydro-2,2-bis[[(1-oxohexyl]oxy]methyl]-1H-perimidin-4-yl]-2,4-dihydroxy-cyclobutenediylium (CAS 211991-63-8), which is commercially available from Eastman Kodak as 211991-63-8, from DKSH as LunaLux 4823, and from H. W. Sands as PSA1345, and whose maximum absorption is at about 823 nm. One preferred infrared dye is a cyanine dye as represented by Formula 1 in U.S. Pat. No. 4,756,993. Specific examples of suitable cyanine dyes include: 2-[2-[2-chloro-3-

[2-(1,3-dihydro-1,3,3-trimethyl-2H-indol-2-ylidene)-ethylidene]-1-cyclohexen-1-yl]-ethenyl]-1,3,3-trimethyl-3H-indolium 4-methylbenzenesulfonate (CAS 205744-92-9), which is commercially available from FEW Chemicals as S 0253 and from H. W. Sands as PSA1177, and whose maximum absorption is at about 775 nm; 2-[2-[2-chloro-3-[2-(1,3-dihydro-1,3,3-trimethyl-2,1-indol-2-ylidene)-ethylidene]-1-cyclopenten-1-yl]-ethenyl]-1,3,3-trimethyl-3H-indolium 4-methylbenzenesulfonate (CAS 193687-61-5), which is commercially available from H. W. Sands as PSA1226 and from FEW Chemicals as S 0337, and whose maximum absorption is at about 797 nm; 2-[2-[2-chloro-3-[2-(1,3-dihydro-1,1,3-trimethyl-2H-benzo[e]-indol-2-ylidene)-ethylidene]-1-cyclohexen-1-yl]-ethenyl]-1,1,3-trimethyl-1H-benzo[e]indolium 4-methylbenzenesulfonate (CAS 134127-48-3), which is commercially available from Honeywell as KF1151, from H. W. Sands as PSA 1411, from FEW Chemicals as S 0094, and from Hampford Research as IR 813 Tosylate, and whose maximum absorption is at about 813 nm; 2-[2-[2-chloro-3-[2-(1,3-dihydro-1,1-dimethyl-3-(4-sulfobutyl)-2H-benz[e]indol-2-ylidene)ethylidene]-1-cyclopenten-1-yl]-1,1-dimethyl-3-(4-sulfobutyl)-1H-benz[e]indolium sodium salt (CAS 162093-45-0), which is commercially available from H. W. Sands as PSA 1354 and whose maximum absorption is 842 nm. For the cationic dyes, common anions include chloride, iodide, tetrafluoroborate, tetraphenylborate, hexafluorophosphate, and 4-methylbenzenesulfonate.

The third ingredient of the image forming composition of this invention is an alkali-soluble polymer. Such polymers are well known in the prior art. Examples of alkali-soluble polymers non-exclusively include copolymers of methyl methacrylate and methacrylic acid, copolymers of maleic acid anhydride and styrene, and copolymers of vinyl acetate and crotonic acid. The phenolic polymers, especially the novolacs, are very suitable for the image forming composition. In one embodiment, the novolac polymer has a number average molecular weight of from about 5,000 to about 50,000. These are described in U.S. Pat. No. 4,708,925. Phenolic polymers, which are used in this invention, are those which are alkali-soluble, namely, contain sufficient phenolic hydroxyl groups to make the polymer substantially soluble in an aqueous alkaline composition. The solubility is such that a thin film of the phenolic polymer coating, in the absence of a dissolution inhibitor, would be removable by soaking and mild rubbing in an aqueous solution of either sodium hydroxide or potassium hydroxide at about 20° C. and at a pH of about 10 within 20 minutes. Phenolic polymers useful for this invention are the condensation products from the interaction between a phenol and an aldehyde. Examples of phenols include C-alkyl substituted phenols (including cresols, xylenols, p-tert-butylphenol, p-phenylphenol and nonyl phenols) and diphenols (including bisphenol-A). Examples of aldehydes include formaldehyde, acetaldehyde, chloral and furfural. The type of catalyst and the molar ratio of the reactants used in the preparation of phenolic polymers determine their molecular structure and therefore the physical properties of the polymer. In general, phenolic polymers known as novolacs are produced if the phenol:aldehyde ratio is above 1 and an acid catalyst is used. On the other hand, phenolic polymers known as resoles are produced if the phenol:aldehyde ratio is below 1 and a base catalyst is used. Of these two classes of phenolic polymers, novolacs are preferred over resoles for the image forming composition. A preferred novolac is a polymer of a cresol reacted with formaldehyde. The most preferred novolac is the polymer of m-cresol:p-cresol:xylenol reacted with formaldehyde. In particular, it has a molecular weight of 15,000 and is commercially available from AZ-Electronic Materials as SPN-402, which is a 44 weight % solution in 1-methoxy-2-propanol. Another novolac polymer is m-cresol:p-cresol (75:25) reacted with formaldehyde, with a molecular weight of 7,000. It is commercially available from Momentive as Durite PD-140A.

In one embodiment, the ketal is present in the image forming composition in an amount of from about 0.5% by weight to about 20%, preferably from about 1% by weight to about 10%, and more preferably from about 2% by weight to about 5%, by weight based on the non-solvent weight of the image forming composition. In one embodiment, the infrared absorbing dye is present in the image forming composition in an amount of from about 0.2% by weight to about 10%, preferably from about 0.5% by weight to about 5%, and more preferably from about 1% by weight to about 3%, by weight based on the non-solvent weight of the image forming composition. In one embodiment, the polymer which is soluble in an aqueous alkaline solution is present in the image forming composition in an amount of from about 40% by weight to about 95%, preferably from about 60% by weight to about 90%, and more preferably from about 70% by weight to about 85%, by weight based on the non-solvent weight of the image forming composition.

In one embodiment, the image forming composition is substantially absent of components which generate an acid upon exposure to actinic radiation. In another embodiment, the image forming composition further comprises one or more components which generate an acid upon exposure to actinic radiation. Non-limiting examples of a component which generates an acid upon exposure to actinic radiation include salts of diazonium, phosphonium, sulfonium, or iodonium with bromide, chloride, tetrafluoroborate, hexafluorophosphate, hexafluoroantimony, hexafluorosilicate, and perchlorate; and halogen-containing organic compounds such as triazines and oxadizoles. In one embodiment, the component which generates an acid upon exposure to actinic radiation is present in the image forming composition in an amount of from about 0.1% by weight to about 20%, preferably from about 0.5% by weight to about 10%, and more preferably from about 0.5% by weight to about 5%, by weight based on the non-solvent weight of the image forming composition.

The image forming composition may further comprise one or more solvents. Suitable solvents non-exclusively include 2-butanone (CAS 78-93-3), 1-methoxy-2-propanol (CAS 107-98-2), cyclohexanone (CAS 108-94-1), and gamma-butyrolactone (CAS 96-48-0), tetrahydrofuran (CAS 109-99-9), propylene glycol monomethyl ether acetate (CAS 108-65-6), methanol (CA 67-56-1), ethanol (CAS 64-17-5). 1-propanol (CAS 71-23-8), 2-propanol (CAS 67-63-0), or mixtures thereof. In general, the solvent system is evaporated from the coating composition once it is applied to an appropriate substrate. However, some insignificant amount of solvent may remain as residue. In one embodiment, the solvent is present in the image forming composition in an amount of from about 30% by weight to about 98%, preferably from about 50% by weight to about 95%, and more preferably from about 80% by weight to about 95%, by weight based on the total weight of the image forming composition.

The image forming composition may further comprise one or more visualization colorants, such as visualization dyes, which aid image visibility. Useful visualization colorants non-exclusively include FEW Chemicals S 0845 having CAS 886046-46-4. The tosylated version of this dye is available as PSA7000 from H. W. Sands and S 2293 from FEW Chemicals. The tosylated version of this dye and with methyl pendant groups instead of butyl groups is S 2295 from FEW Chemicals. NK4286 has CAS 1115209-44-3. It is also available as S 2294 from FEW Chemicals. The tosylated version of this dye is a preferred colorant. The colorant dye can be CAS 886046-46-4, which is commercially available from St-Jean Photochemie as CYD-1006 and from H. W. Sands as PSA1201 which has iodide as its counter ion and an absorption maximum at 587 nm. A similar colorant dye is NK4286 which has pentyl pendant groups instead of butyl pendant groups. Another colorant dye can be CAS 189189-12-6, which is commercially available from H. W. Sands as PSA1373. It is the same as CAS 886046-46-4 except that its counter ion is perchlorate. It has an absorption maximum at 587 nm. Another preferred colorant dye is similar to CAS 886046-46-4 but with the counter ion replaced by 4-methyl benzene sulfonate. Another colorant dye may be CAS 1325-86-6, such as Oil Blue 613, which is a nonionic compound. In one embodiment, the visualization colorant is present in the image forming composition in an amount of from about 0.2% by weight to about 10%, preferably from about 0.5% by weight to about 5%, and more preferably from about 1% by weight to about 3%, by weight based on the non-solvent weight of the image forming composition.

The image forming composition may further comprise one or more dissolution promoters such as an organic acid cyclic anhydride, such as those described in U.S. Pat. No. 4,115,128, in particular phthalic anhydride (CAS 85-44-9) and cis-1,2,3,6-tetrahydrophthalic anhydride (CAS 935-79-5). Other dissolution promoters include copolymers of methacrylate and copolymers of methyl methacrylate, in particular copolymers of acrylonitrile/4-maleimidophenol/methyl methacrylate, and copolymers of acrylonitrile/4-maleimidophenol/2-hydroxyethyl methacrylate/methyl methacrylate/N-(4-aminosulfonylphenyl)methacrylamide These copolymers make the coating develop faster. In one embodiment, the dissolution promoter is present in the image forming composition in an amount of from about 1% by weight to about 20%, preferably from about 2% by weight to about 10%, and more preferably from about 3% by weight to about 8%, by weight based on the non-solvent weight of the image forming composition.

The image forming composition may further comprise one or more surfactants, in particular, non-ionic surfactants. Useful surfactants include CAS 753501-40-5 from PolyFox as PF-6520; and CAS 556-67-2 from BYK-Chemie as BYK 307 and from Dow Corning as 3225C. In one embodiment, the surfactant is present in the image forming composition in an amount of from about 0.05% by weight to about 5%, preferably from about 0.1% by weight to about 2%, and more preferably from about 0.2% by weight to about 1%, by weight based on the non-solvent weight of the image forming composition.

The image forming composition may further comprise a glycol such as a poly(ethylene glycol) having a number average molecular weight of from about 2,000 to about 8,000, as mentioned in U.S. Pat. No. 6,391,512. Poly(ethylene glycol) $M_n$ 4,000 is useful. The poly(ethylene glycol) serves to improve press performance when the image forming composition is part of a lithographic printing plate by increasing run length, namely, the number of good quality printing impressions obtainable from the plate. In one embodiment, the poly (ethylene glycol) is present in the image forming composition in an amount of from about 1% by weight to about 20%, preferably from about 1% by weight to about 10%, and more preferably from about 2% by weight to about 8%, by weight based on the non-solvent weight of the image forming composition.

An image forming element may be produced by providing a planar substrate, coating the image forming composition onto the substrate and then substantially drying the image forming composition into a layer. Substrates useful for coating with the image forming composition of this invention to form an image forming element include sheets of transparent films such as polyester, aluminum and its alloys, as well as other metals, silicon and similar materials which are well known in the art. Preferably, the substrate comprises aluminum for the formation of a lithographic printing plate. In the production of image forming elements such as lithographic printing plates, an aluminum substrate is first preferably degreased such as with an aqueous combination of sodium hydroxide and sodium gluconate and then rinsed with water. It is then preferably pretreated by graining by art recognized methods such as by means of a wire brush, a slurry of particulates, or etching or graining by chemical or electrochemical means, for example in an aqueous electrolyte solution comprising hydrochloric acid or in an aqueous combination of hydrochloric acid and acetic acid, as is well known in the art. The roughness $R_a$ of the surface may range from about 0.1 μm to about 0.8 μm. The grained plate is preferably then anodized for example in sulfuric or phosphoric acid in a manner well known in the art. The anodic film thickness may range from about 0.1 $g/m^2$ to about 5 $g/m^2$. The grained and anodized surface is preferably then rendered hydrophilic by treatment with sodium silicate or polyvinyl phosphonic acid by means which are also known to the skilled artisan to form at least one hydrophilic surface on the aluminum substrate. The thusly prepared plate is then coated with the image forming composition of the present invention, preferably at a coating weight of from about 0.6 $g/m^2$ to about 2.5 $g/m^2$, more preferably from about 0.8 $g/m^2$ to about 2.0 $g/m^2$, and most preferably from about 1.2 $g/m^2$ to about 1.5 $g/m^2$, although these coating weights are not critical to the practice of this invention, and then dried. In an embodiment of the invention, the dried image forming layer is then conditioned by heating at a temperature of from about 40° C. to about 70° C. for from about 2 hours to about 200 hours which further reduces the amount of residual solvent.

The thusly formed image forming element is then imagewise exposed to sufficient infrared radiation to thereby provide imagewise exposed areas and non-exposed areas of the image forming composition. The imagewise exposing may be conducted with a laser which generates infrared radiation having a wavelength of from about 730 nm to about 1120 nm, more preferably from about 800 nm to about 850 nm. The laser is preferably a diode laser due to its reliability and low maintenance. Alternatively, a gas laser could be used. Commercially available imagesetters with laser diodes presently emit infrared radiation with peak output from about 820 nm to about 840 nm. Less powerful diode lasers have their peak output at about 780 nm, 1060 nm, or 1120 nm. It is readily apparent to one skilled in the art that the wavelength at the absorption maximum of the infrared absorbing dye should closely match that of the laser output.

The imagewise exposed image forming element is then developed to remove the nonimage areas while allowing the image areas to remain. Development may be conducted by immersion in an aqueous alkaline solution with slight rubbing at from about 15° C. to about 35° C. for from about 5 seconds to about 60 seconds. Useful developers are well known in the art and generally commercially available. Preferred developers may include aqueous solutions of hydroxides such as sodium hydroxide and potassium hydroxide; silicates such as sodium silicate and potassium silicate, phosphates such as sodium phosphate and potassium phosphate; glycerin, and surfactants such as Dowfax 2A1 (CAS 119345-04-9) which is available commercially from Dow Chemical.

The exposed and developed image may optionally be subjected to a post-exposure baking treatment such as at from about 200° C. to about 250° C. for from about 1 minute to about 30 minutes to toughen the image. However, this post-exposure baking treatment is not necessary in most cases.

The following non-limiting examples serve to illustrate the invention.

EXAMPLES

An aluminum substrate was prepared by degreasing a sheet of aluminum (alloy 1052 with a hardness of H18 and thickness of 0.30 mm) with an aqueous combination of sodium hydroxide and sodium gluconate, rinsing it with water, electrochemically graining it in an aqueous combination of hydrochloric acid and acetic acid, rinsing it with an aqueous solution of phosphoric acid, anodizing it in an aqueous solution of sulfuric acid, rinsing it with deionized water, rinsing it with an aqueous solution of polyvinylphosphonic acid, rinsing it with deionized water, and then drying it. The anodic film thickness was 3.0 g/$m^2$. The roughness of the surface was $R_a$=0.5 μm.

K1 was prepared by reacting a mixture of 72 g (0.5 mol) of 1,1-dimethoxycyclohexane, 250 g (1.0 mol) of 2-[4-(1,1,3,3-tetramethylbutyl)phenoxy]ethanol, 0.080 g of p-toluenesulfonic acid, and 300 ml of toluene in a flask with a thermometer and fractional distillation column at 120° C. for 8 hours with continuous stirring. The low boiling methanol that was produced during the reaction was removed. The reaction mixture was cooled to room temperature and washed with a small amount of an aqueous 1.0 M sodium hydroxide solution until the mixture was neutralized. The reaction mixture was then washed with a saturated sodium chloride solution to remove any remaining water in the toluene. Next the reaction mixture was dried over anhydrous potassium carbonate to remove any minor amounts of water and to make sure all of the p-toluenesulfonic acid was removed. The resulting mixture was filtered. The filtrate was evaporated under reduced pressure at 60° C. until all of the toluene was removed. A high viscosity, clear liquid was obtained upon cooling to room temperature, and is partially soluble in water. This ketal can be converted back to the starting surfactant and cyclohexanone by the addition of an acid, such as p-toluenesulfonic acid. The starting surfactant is water-insoluble. This ketal K1 with a theoretical molecular weight of 580 has the structural formula shown below.

K1

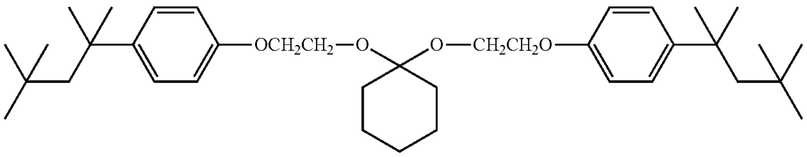

Examples 1 to 4

Coating solutions were prepared based upon a standard formulation with the following ingredients, given in weight percent. The only difference was the type of ketal.

40.00% 2-butanone (CAS 78-93-3)
40.00% 1-methoxy-2-propanol (CAS 107-98-2)
10.00% gamma-butyrolactone (CAS 96-48-0)
8.30% novolac resin (Mw 15,000)
0.70% phthalic anhydride (CAS 85-44-9)
0.25% IR dye (CAS 134127-48-3)
0.25% colorant (tosylated version of CAS 886046-4)
0.15% poly(ethylene glycol) (Mw 4000) (CAS 25322-68-3)

Example 2 contained ketal K2, which has the chemical structure of Formula 1 wherein R' and R" each are a branched-chain alkyl group having 8 carbon atoms, and wherein m and n each are the integer 5, giving an average of 5 ethoxy groups on each side. K2 was prepared by reacting a mixture of 426 g (1.0 mol) of Igepal CA-520 instead of 250 g (1.0 mol) of 2-[4-(1,1,3,3-tetramethylbutyl)phenoxy]ethanol. Igepal CA-520, is a 2-{2-[4-(1,1,3,3-tetramethylbutyl)phenoxy] polyethoxy}ethanol, commercially available from Rhodia where the average number of ethoxy groups in the polyethoxy chain is 4. A medium viscosity, clear liquid was obtained upon cooling to room temperature, and is partially soluble in water. This ketal K2 with a theoretical molecular weight of 932 has the structural formula shown below.

K2

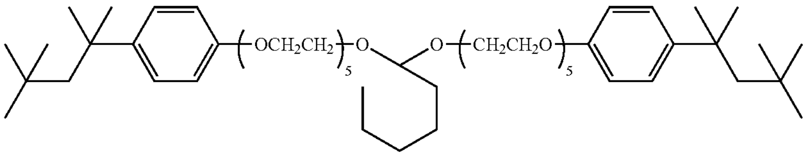

0.05% surfactant (CAS 753501-40-5)
0.30% ketal

Example 1 contained ketal K 1, which has the chemical structure of Formula 1 wherein R' and R" each are a branched-chain alkyl group having 8 carbon atoms, and wherein m and n each are the integer 1, giving one ethoxy group on each side.

Example 3 contained ketal K3, which has the chemical structure of Formula 1 wherein R' and R" each are a branched-chain alkyl group having 8 carbon atoms, and wherein m and n each are the integer 10, giving an average of 10 ethoxy groups on each side. The procedure as described for K1 in Example 1 was repeated but with 646 g (1.0 mol) of Triton X-100 instead of 250 g (1.0 mol) of 2-[4-(1,1,3,3-tetramethylbutyl)phenoxy]ethanol. Triton X-100 is 2-{2-[4-(1,1,3,3-tetramethylbutyl)phenoxy]polyethoxy)ethanol commercially available from Dow Chemical where the average number of ethoxy groups in the polyethoxy chain is 9. A medium viscosity, clear liquid was obtained upon cooling to room temperature, and is partially soluble in water. This ketal K3 with a theoretical molecular weight of 1372 has the structural formula shown below.

K3

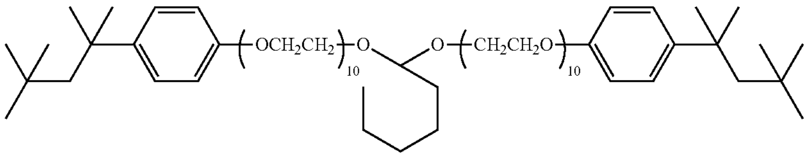

Example 4 contained ketal K4, which has the chemical structure of Formula 1 wherein R' and R" each are a branched-chain alkyl group having 8 carbon atoms, and wherein m and n each are the integer of 30, giving an average of 30 ethoxy groups on each side. Triton X-305 is commercially available from Dow Chemical as a 70% solid in water. The solution was heated to 85° C. to remove the water. The resulting solid is 2-{2-[4-(1,1,3,3-tetramethyl butyl)phenoxy] polyethoxy}ethanol where the average number of ethoxy groups in the polyethoxy chain is 29. This solid is readily soluble in toluene. The procedure as described for K1 in Example 1 was repeated using 1526 g (1.0 mol) of this solid instead of 250 g (1.0 mol) of 2-[4-(1,1,3,3-tetramethylbutyl) phenoxy]ethanol. A waxy solid (m.p. 42° C.) was obtained upon cooling to room temperature, and is soluble in water. This ketal K4 with a theoretical molecular weight of 3132 has the structural formula shown below.

K4

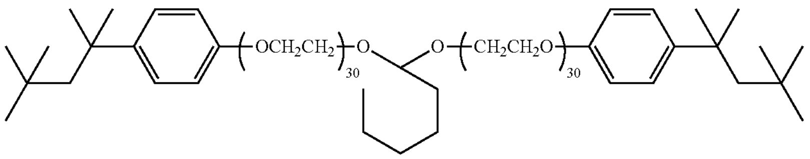

Comparative Examples KA to KE

Comparative Example KA contained 1,1-dimethoxycyclohexane (CAS 933-40-4) with a molecular weight of 144, as the ketal. Comparative Example KB contained 1,1-diethoxycyclohexane (CAS 1670-47-9) with a molecular weight of 172. Comparative Example KC contained 1,1-di(1-methylethoxy)cyclohexane (CAS 1132-95-2) with a molecular weight of 200. Comparative Example KD contained 1,1-di (2-phenoxyethoxy)cyclohexane (CAS 115815-82-2), which has the chemical structure of Formula 1 wherein R' and R" do not exist, and wherein m and n each are the integer 1, giving one ethoxy group on each side. This ketal was made from 2-phenoxyethanol. The procedure as described for Ketal 1 in Example 1 was repeated for making 1,1-di(2-phenoxyethoxy)cyclohexane but with 138 g (1.0 mol) of 2-phenoxyethanol instead of 250 g (1.0 mol) of 2-[4-(1,1,3,3-tetramethylbutyl)phenoxy]ethanol. A white crystalline material (m.p. 50° C.) formed after sitting for a week in an open container at room temperature. When the crystalline material was heated to 85° C. and then cooled to room temperature, the formed liquid would again take more than a day to recrystallize at room temperature. This ketal is water-insoluble. It can be converted back to the starting alcohol and cyclohexanone by the addition of an acid, such as p-toluenesulfonic acid. The starting alcohol 2-phenoxyethanol has low water solubility. This ketal with a molecular weight of 356 has the structural formula shown below.

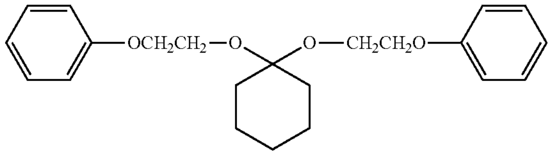

Comparative Example KE contained 1,1-di{2-[4-(1,1-dimethylethyl)phenoxy]ethoxy}cyclohexane, as the ketal. This ketal has the chemical structure of Formula 1 wherein R' and R" each are a branched-chain alkyl group having 4 carbon atoms, and wherein m and n each are the integer 1, giving one ethoxy group on each side. This ketal was made from 2-[4-(1,1-dimethylethyl)phenoxy]ethanol. The procedure as described for Ketal 1 in Example 1 was repeated but with 194 g (1.0 mol) of 2-[4-(1,1-dimethylethyl)phenoxy]ethanol instead of 250 g (1.0 mol) of 2-[4-(1,1,3,3-tetramethylbutyl) phenoxy]ethanol. A white crystalline material (m.p. 46° C.) formed after one day in an open container at room temperature. When the crystalline material was heated to 85° C. and then cooled to room temperature, the formed liquid would again take more than a day to recrystallize at room temperature. This ketal is water-insoluble. It can be converted back to the starting alcohol and cyclohexanone by the addition of an acid, such as p-toluenesulfonic acid. The starting alcohol 2-[4-(1,1-dimethylethyl)phenoxy]ethanol is also water-insoluble. This ketal with a molecular weight of 468 has the structural formula shown below.

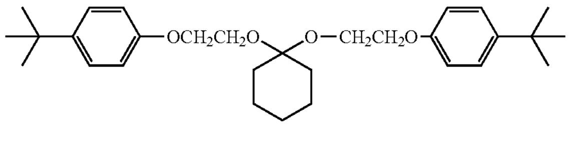

Comparative Examples R1 to R4, and RA to RE

The following comparative examples were prepared in which the ketal was replaced by the relevant alcohol. Comparative Example R1 contained 2-[4-(1,1,3,3-tetramethylbutyl)phenoxy]ethanol (CAS 9036-19-5), instead of ketal K1. Comparative Examples R2, R3, and R4 contained Igepal CA-520, Triton X-100, and Triton X-305, respectively. Comparative Example RA contained methanol (CAS 67-56-1), instead of the ketal 1,1-dimethoxycyclohexane. Comparative Example RB contained ethanol (CAS 64-17-5), instead of the ketal 1,1-diethoxycyclohexane. Comparative Example RC contained 2-propanol (CAS 67-63-0), instead of ketal 1,1-di (1-methylethoxy)cyclohexane. Comparative Example RD contained 2-phenoxyethanol (CAS 122-99-6), which is commercially available as Dowanol EPh from Dow Chemical Company. Comparative Example RE contained 2-[4-(1,1-dimethylethyl)phenoxy]ethanol (CAS 713-46-2).

Comparative Examples X and Y

Comparative Example X did not contain a ketal. An additional 0.30% of 2-butanone (CAS 78-93-3) compensated for the lack of a ketal. Comparative Example Y contained cyclohexanone (CAS 108-94-1) instead of a ketal.

Coating and Evaluation

All of the above-mentioned, infrared-sensitive solutions were coated onto the prepared aluminum substrate with a slot coater to a dry coating weight of 1.7 g/m$^2$. The coating was dried at 110° C. for 1 minute. The amount of residual solvent was 0.8 mg/dm$^2$. The coated plates were then conditioned at 55° C. for 3 days before use. This conditioning step reduced the amount of residual solvent to 0.4 mg/dm$^2$. The dried, coated, conditioned plates were then exposed to 830 nm irradiation at different powers from a Trendsetter 3240, which is manufactured by Creo, and then developed with the following developer at 28° C. for a dip-to-nip dwell time of 15 seconds.

3.5% potassium hydroxide (CAS 1310-58-3)
4.0% potassium silicate (2.5 weight ratio $SiO_2$:$K_2O$) (CAS 1312-76-1)
2.0% tripotassium phosphate (CAS 7778-53-2)
5.0% glycerin (CAS 56-81-5)
0.5% Dowfax 2A 1 (CAS 119345-04-9) (from Dow Chemical)
75.0% water (CAS 7732-18-5)

After development, the optical density of the exposed areas that had received different irradiation intensities was measured. The lowest intensity of irradiation that gave a clean background, namely, no staining, was recorded at the first clear step. This intensity at the first clear step was then multiplied a safety factor of 1.3 to get an apparent photospeed in mj/cm$^2$. This photospeed was rated relative to that of Comparative Example KD, which was 110 mj/cm$^2$. For photospeed in Table 2, a plus sign means a faster photospeed than that of KD, a zero means same photospeed, and a negative sign means a slower photospeed. In other words, a plus sign means that the plate required less irradiation intensity than KD, a zero means the same intensity, and a minus sign means more irradiation. A new plate of each type was then exposed at the safety factor intensity, as calculated for that particular type of plate. This second set of plates was then put onto a Heildelberg MO Single Color press in groups of six different plates on the plate drum and then run to 50.000 impressions with blanket-overpacking to accelerate wear of the images on the plate. For press life in Table 2, a plus sign means a stronger coating than that with KD, a zero means the same strength, and a negative sign means a weaker coating. In other words, a plus sign means less wear than that with KD, a zero means the same wear, and a negative sign means more wear. The amount of wear was mathematically determined by optically measuring the dot sizes on the individual plates initially and then again after 50,000 impressions. The difference between the initial value and the final value corresponded to press life. The initial dot sizes were comparable between the different Examples and Comparative Examples. In other words, the initial resolution was similar in all cases.

TABLE 2

| With Ketal | | | Without Ketal | | |
|---|---|---|---|---|---|
| Ex. | Photospeed | Press Life | Ex. | Photospeed | Press Life |
| 1 | 0 | + + + + | R1 | − − − | + |
| 2 | 0 | + + + | R2 | − − − | 0 |
| 3 | 0 | + + | R3 | − − − | − − |
| 4 | − | + | R4 | − − − − − | − − − |
| KA | 0 | − − | RA | 0 | − − |
| KB | 0 | − − | RB | 0 | − − |
| KC | 0 | − − | RC | 0 | − − |
| KD | 0 | 0 | RD | 0 | − − |
| KE | 0 | − | RE | 0 | − − |
| | | | X | 0 | − − |
| | | | Y | 0 | − − |

Of the Comparative Examples with ketals, Comparative Example KD had the best press life with the least wear. However, Examples 1, 2, and 3 with the new ketals of the present invention have much better press life without any reduction in photospeed, relative to Comparative Example KD. Example 4 with one of the new ketals of the present invention had a better press life with a slight reduction in photospeed, relative to Comparative Example KD.

Comparative Example R1 with the alcohol 2-[4-(1,1,3,3-tetramethylbutyl)phenoxy]ethanol instead of a ketal also has a good press life but with a considerable, unacceptable reduction in photospeed. Comparative Example R2 with Igepal CA-520 instead of a ketal had a similar press life but also an unacceptable photospeed. All of the other Comparative Examples with alcohols, namely, R3, R4, RA, RB, RC, RD, and RE, had poorer press life.

Example 5

Example 5 used 0.15% ketal K4, which is half of that amount used in Example 4. The difference in weight was made up by adding an equal amount of 1-methoxy-2-propanol. The solution was coated, dried, conditioned, exposed, and developed as described above.

Comparative Example KF

Comparative Example KF was prepared like Example 5 but with ketal 1,1-di(2-phenoxyethoxy)cyclohexanone (CAS 115815-82-2) instead of ketal K4. This Comparative Example KF is similar to Comparative Example KD but with half of the ketal amount.

TABLE 3

| With Ketal | | | With Half Ketal | | |
|---|---|---|---|---|---|
| Ex. | Photospeed | Press Life | Ex. | Photospeed | Press Life |
| 4 | − | + | 5 | 0 | + |
| KD | 0 | 0 | KF | 0 | − |

The reduction in ketal K4 concentration in Example 5 improved the photospeed while maintaining the better press life, whereas the drop in ketal 1,1-di(2-phenoxyethoxy)cyclohexanone (CAS 115815-82-2) concentration in Comparative Example KF maintained the photospeed but decreased the press life. This difference may be due to the much higher Mw (3132) of K4 relative to that (356) of the other ketal.

Examples 6 to 8

The above formulation for Examples 1 to 4 was slightly modified by adding triazine B and removing an equal amount of novolac resin. The only difference was the type of ketal.

40.00% 2-butanone (CAS 78-93-3)
40.00% 1-methoxy-2-propanol (CAS 107-98-2)
10.00% gamma-butyrolactone (CAS 96-48-0)
8.25% novolac resin (Mw 15,000)
0.70% phthalic anhydride (CAS 85-44-9)
0.25% IR dye (CAS 134127-48-3)
0.25% colorant (tosylated version of CAS 886046-4)
0.15% poly(ethylene glycol) (Mw 4000) (CAS 25322-68-3)
0.05% surfactant (CAS 753501-40-5)
0.05% triazine B (CAS 69432-40-2)
0.30% ketal Examples 6, 7, and 8 contained ketal K1, K2, and K3, respectively. These solutions were coated, dried, conditioned, exposed, and developed exactly as described above.

Comparative Example KG was prepared like Examples 6 to 8 but with ketal 1,1-di(2-phenoxyethoxy)cyclohexane (CAS 115815-82-2), which is the same ketal as in Comparative Example KD.

TABLE 4

| With Ketal | | | With Ketal Plus Triazine | | |
|---|---|---|---|---|---|
| Ex. | Photospeed | Press Life | Ex. | Photospeed | Press Life |
| 1 | 0 | + + + + | 6 | – | + + + + |
| 2 | 0 | + + + | 7 | – | + + + |
| 3 | 0 | + + | 8 | – | + + |
| KD | 0 | 0 | KG | – | 0 |

In Examples 6 to 8 and Comparative Example KG with triazine B, relative to their respective Examples 1 to 3 and Comparative Example KD without a triazine, the addition of triazine B slightly decreased the photospeed, which may be due to development inhibition by this triazine. It has been suggested by others that triazine B, namely, compound 13 in U.S. Pat. No. 6,391,512, can decompose ketal 1,1-di(2-phenoxyethoxy)cyclohexane (CAS 115815-82-2), which was used in Comparative Examples KD and KG. The generation of the acid in the exposed areas is supposed to increase the solubility of that area in a developer. However, we found the opposite effect, namely, that the exposed areas actually developed slower with the addition of triazine B.

In Examples 6 to 8 and Comparative Example KG, the addition of triazine B did not appear to affect the press life, positively or negatively. There was no apparent advantage to adding triazine B to the formulation with regard to photospeed and press life. However, there was a clear disadvantage to adding triazine B to the coatings, namely, with regard to white light sensitivity. The coatings with the triazine B were pre-exposed when stored under white light. Therefore, these coatings with the triazine B needed to be stored and handled in the dark or under yellow lights before the image exposure and development.

Examples 9 and 10

The above formulation for Examples 1 to 4 was slightly simplified by removing the phthalic anhydride (PA) and the poly(ethylene glycol) (PEG). The missing components were replaced by additional novolac resin. The only difference was the type of ketal.

40.00% 2-butanone (CAS 78-93-3)
40.00% 1-methoxy-2-propanol (CAS 107-98-2)
10.00% gamma-butyrolactone (CAS 96-48-0)
9.15% novolac resin (Mw 15,000)
0.25% IR dye (CAS 134127-48-3)
0.25% colorant (tosylated version of CAS 886046-4)
0.05% surfactant (CAS 753501-40-5)
0.30% ketal Examples 9 and 10 contained ketal K1 and K2, respectively. These solutions were coated, dried, conditioned, exposed, and developed exactly as described above.

Comparative Example KH was prepared like Examples 9 and 10 but with ketal 1,1-di(2-phenoxyethoxy)cyclohexane (CAS 115815-82-2), which is the same ketal as in Comparative Example KD.

TABLE 5

| With PA + PEG | | | Without PA + PEG | | |
|---|---|---|---|---|---|
| Ex. | Photospeed | Press Life | Ex. | Photospeed | Press Life |
| 1 | 0 | + + + + | 9 | 0 | + + + |
| 2 | 0 | + + + | 10 | 0 | + + |
| KD | 0 | 0 | KH | – | – – |

The elimination of phthalic anhydride and poly(ethylene glycol) had no effect on the photospeed in Examples 9 and 10, whereas it did slow down the photospeed in Comparative Example KH. Furthermore, the elimination had a smaller negative effect on the press life in Examples 9 and 10 than in Comparative Example KH. This difference in press life may be due to the more lipophilic nature of the ketals K1 and K2 that have pendant branched-chain octyl groups, in comparison to the similar ketal 1,1-di(2-phenoxyethoxy)cyclohexanone (CAS 115815-82-2) that does not have any pendant groups. In general, the addition of poly(ethylene glycol) increases the press life.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. An image forming composition which comprises:

a) a ketal having the formula:

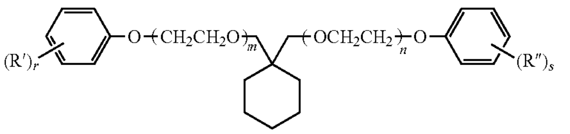

wherein R' and R" independently are an alkyl group having from 8 to about 20 carbon atoms:

m and n independently are an integer of from 1 to about 200; and r and s independently are an integer of from 1 to 3;

b) an infrared absorbing dye which has a maximum absorption peak in the range of from about 700 nm to about 1100 nm; and c) a polymer which is soluble in an aqueous alkaline solution.

2. The image forming composition of claim 1 which is substantially absent of components which generate an acid upon exposure to actinic radiation.

3. The image forming composition of claim 1 which further comprises a component which generates an acid upon exposure to actinic radiation.

4. The image forming composition of claim 1 further comprising a solvent.

5. The image forming composition of claim 1 further comprising a visualization colorant.

6. The image forming composition of claim 5 wherein the visualization colorant comprises a visualization dye.

7. The image forming composition of claim 1 wherein the polymer which is soluble in an aqueous alkaline solution comprises a novolac polymer.

8. The image forming composition of claim 7 wherein the novolac polymer has a number average molecular weight of from about 5,000 to about 50,000.

9. The image forming composition of claim 1 further comprising a phthalic anhydride.

10. The image forming composition of claim 1 further comprising a nonionic surfactant.

11. The image forming composition of claim 1 further comprising a poly(ethylene glycol) having a number average molecular weight of from about 2,000 to about 8.000.

12. The image forming composition of claim 1 further comprising a copolymer of acrylonitrile and methyl methacrylate.

13. An image forming element which comprises a substrate, and the image forming composition of claim 1 substantially dried on the substrate.

14. A planographic printing plate comprising a planar substrate having at least one a hydrophilic surface; and an image forming layer substantially dried on the at least one hydrophilic surface; the image forming layer comprising the image forming composition of claim 1.

15. The planographic printing plate of claim 14 wherein the substrate comprises aluminum.

16. A method for forming a planographic printing plate which comprises providing a planar substrate which comprises aluminum having at least one hydrophilic surface; applying the image forming composition of claim 1 onto at least one said hydrophilic surface; drying the image forming composition to thereby produce a dried image forming layer; and then conditioning the dried image forming layer at a temperature of from about 40° C. to about 70° C. for from about 2 hours to about 200 hours.

17. A method for forming an image which comprises:

a) providing an image forming element which comprises the image forming element of claim 13;

b) imagewise exposing the substantially dried image forming composition to sufficient infrared radiation to thereby provide imagewise exposed areas and non-exposed areas of the image forming composition; and then c) developing the image forming element by removing the imagewise exposed areas of the image forming composition and not removing the non-exposed areas of the image forming composition, with an aqueous alkaline composition.

18. The method of claim 17 wherein the imagewise exposing is conducted with a laser which generates infrared radiation having a wavelength of from about 770 nm to about 830 nm.

* * * * *